(12) United States Patent
Burns et al.

(10) Patent No.: US 7,347,329 B2
(45) Date of Patent: Mar. 25, 2008

(54) SUBSTRATE CARRIER

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US); Michael Zabka, Eagan, MN (US)

(73) Assignee: Entegris, Inc., Chaska, MN (US)

( * ) Notice: Subject to any disclaimer, the term of this patent is extended or adjusted under 35 U.S.C. 154(b) by 85 days.

(21) Appl. No.: 10/971,714

(22) Filed: Oct. 22, 2004

(65) Prior Publication Data

US 2005/0109668 A1 May 26, 2005

Related U.S. Application Data

(60) Provisional application No. 60/514,040, filed on Oct. 24, 2003.

(51) Int. Cl.
*B65D 85/00* (2006.01)

(52) U.S. Cl. .................. 206/711; 206/710; 206/832; 206/722; 16/422; 16/425; 220/756; 220/759; 220/768; 220/772

(58) Field of Classification Search .............. 206/701, 206/710, 711, 722, 723, 728, 832; 16/423, 16/425, 444; 220/756, 759, 768, 770, 772
See application file for complete search history.

(56) References Cited

U.S. PATENT DOCUMENTS

| | | | |
|---|---|---|---|
| 3,727,265 A * | 4/1973 | Camp .......................... 16/444 |
| 4,532,970 A | 8/1985 | Tullis et al. |
| 4,534,389 A | 8/1985 | Tullis |
| 5,115,894 A * | 5/1992 | Kuo .......................... 190/117 |
| 5,711,427 A | 1/1998 | Nyseth |
| 5,788,082 A * | 8/1998 | Nyseth ...................... 206/711 |
| 5,974,627 A * | 11/1999 | Huang ......................... 16/422 |
| 6,010,008 A | 1/2000 | Nyseth et al. |
| 6,105,782 A | 8/2000 | Fujimori et al. |
| 6,223,396 B1 * | 5/2001 | Wartenbergh ................ 16/430 |
| 6,273,261 B1 * | 8/2001 | Hosoi ......................... 206/711 |
| 6,354,601 B1 * | 3/2002 | Krampotich et al. ........ 277/628 |
| 6,382,419 B1 | 5/2002 | Fujimori et al. |
| 6,398,033 B1 * | 6/2002 | Wu et al. .................... 206/711 |
| 6,779,667 B2 * | 8/2004 | Nigg et al. .................. 206/711 |
| 6,923,325 B2 * | 8/2005 | Duban-Hu et al. ......... 206/711 |
| 7,017,750 B2 | 3/2006 | Matsutori et al. |
| 7,073,999 B2 | 7/2006 | Oyama |
| 2001/0040116 A1 | 11/2001 | Hyobu et al. |
| 2003/0002961 A1 | 1/2003 | Davis et al. |

* cited by examiner

*Primary Examiner*—Mickey Yu
*Assistant Examiner*—Steven Pollicoff
(74) *Attorney, Agent, or Firm*—Patterson, Thuente, Skaar & Christensen, P.A.

(57) ABSTRACT

A carrier for transporting silicon semiconductor wafers during semiconductor wafer processing operations including an enclosure, a door and a flange structured to interface with a machine so that the carrier can be lifted by the machine. A lift saddle connects the flange to the container so that the load on the flange is transferred to a part of the enclosure other than the top of the enclosure to prevent distortion of the enclosure to maintaining seal integrity between the enclosure and the door.

14 Claims, 4 Drawing Sheets

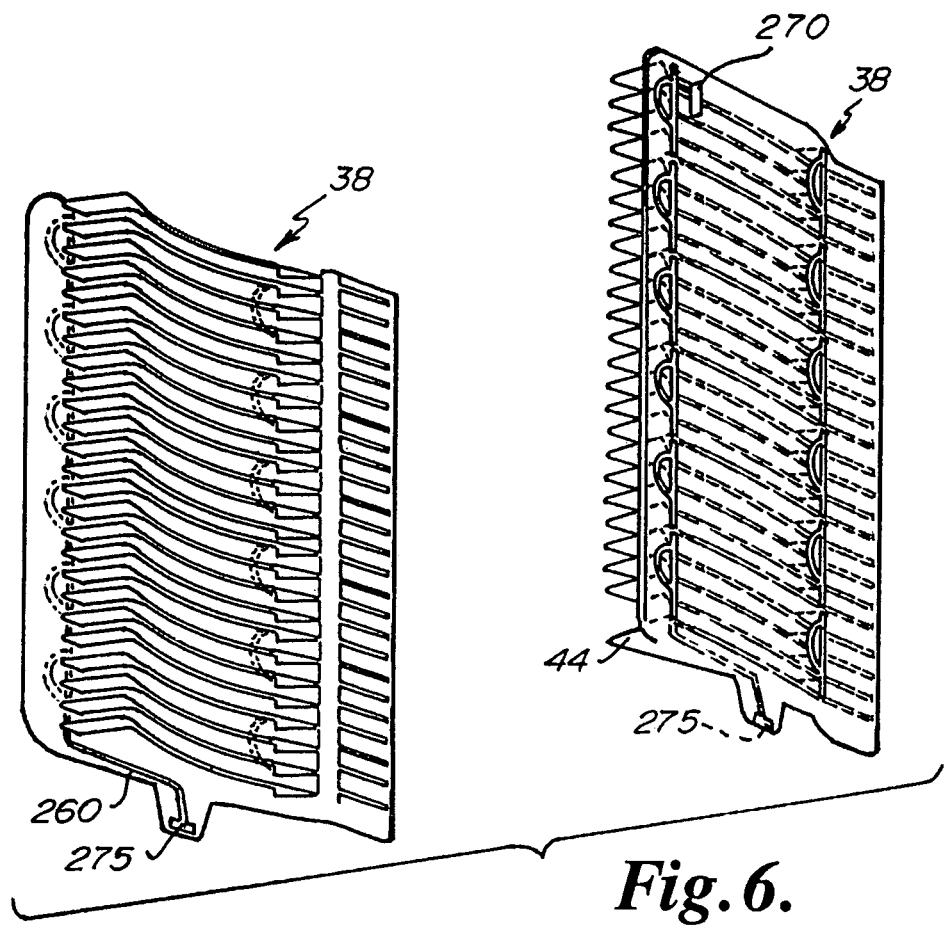
Fig. 6.
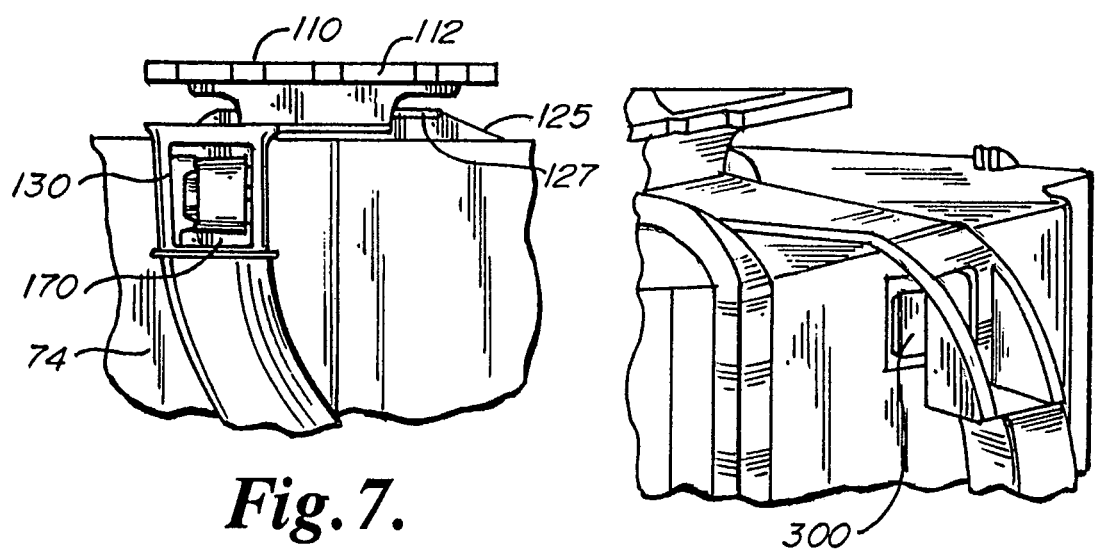
Fig. 7.
Fig. 8.

SUBSTRATE CARRIER

This application claims the benefit of U.S. Provisional Application Ser. No. 60/514,040 filed Oct. 24, 2003, the same being incorporated herein by reference.

FIELD OF THE INVENTION

This invention relates to semiconductor wafer processing equipment, and more particularly to silicon wafer carriers used to protectively house a plurality of semiconductor wafers for automated handling during semiconductor wafer processing operations.

BACKGROUND OF THE INVENTION

The manufacture of an integrated circuit involves a plurality of operations on wafers of semiconductor substrates. Some of the operations may include processing steps such as photolithography, etching, exposure, as well as inspection and testing of the wafer as it is being formed into the desired end product. Some of these operations involve automated material handling and processing using robotic end-effectors. Many of these operations require a clean room environment devoid of airborne particulates and other contaminants which would seriously compromise the quality of the end product.

Specialized equipment, such as standard wafer pods, have been developed to provide the requisite contamination-free storage environment for the wafers during transfer and processing. For example, Front Opening Unified Pods (FOUPS) provide a protective, sealed, contamination-free enclosure for the wafers. Other versions of containers such as Standard Mechanical Interface (SMIF) pods may also be used for handling of semiconductor wafers both inside and outside of clean rooms depending on the size of the wafers. Commonly assigned U.S. patent application entitled "Transport Module", Ser. No. 08/891,644, filed Jul. 11, 1997, now U.S. Pat. No. 6,010,008 ('008), as well as U.S. patent application entitled "Wafer Carrier with Door", Ser. No. 678,885, filed Jul. 12, 1996, now U.S. Pat. No. 5,711,427 ('427) disclose wafer containers that have features exemplifying such a FOUP. The specification of these applications is incorporated herein by specific reference.

For wafers in the range of 200 mm and smaller, SMIF pods have been utilized to provide a clean sealed mini-environment. Examples of these pods are shown in U.S. Pat. Nos. 4,532,970 and 4,534,389. As discussed in the '008 patent, such SMIF pods typically utilize a transparent box-shaped shell with a lower door frame or flange defining an open bottom and a latchable door. The door frame clamps onto processing equipment and a door on the processing equipment and the lower SMIF pod door closing the open bottom are simultaneously lowered downwardly from the shell into a sealed processing environment in said processing equipment. A separate H-bar carrier positioned on the top surface inside of the SMIF pod door and loaded with wafers is lowered with the pod door for accessing and processing said wafers. In such pods the weight of the wafers would be directly on the door during storage and transport.

With the advent of the larger and heavier wafers, specifically the 300 mm wafers, the transport modules for such wafers have evolved so that they now utilize a front opening door for insertion and removal of the wafers as opposed to a bottom door that drops downwardly from the module. The door cannot support the load of the wafers, rather a container portion which includes a clear plastic (such as polycarbonate) shell and other members for supporting the wafers molded from a low particle generating plastic (such as polyetheretherketone) carry the load of the wafers. Such container portions necessarily are made from multiple components assembled together. Because electrostatic discharges can damage or ruin semiconductor wafers, static electricity is a continuing concern in the handling and processing of such wafers. To minimize any such generation of potentials which may cause static electric discharges, the carriers are typically manufactured with conventional static dissipative materials such as carbon filled polyetheretherketone (PEEK) and polycarbonate (PC).

Industry standards for such modules require that the module be capable of interfacing with external processing equipment. For example, the module may need to repeatedly and with precision align with a robotic handling means which engages the door on the front side of the module, opens the door, and with the necessary amount of precision grasps and removes specific horizontally arranged wafers. It is critical that the module and the wafers contained within the module be positioned at a particular height and orientation with reference to an external equipment machine interface such that the wafers will not be located and damaged during the robotic withdrawal and insertion of said wafers.

Additionally, due to the high susceptibility of wafers to contamination by particles, moisture or other contaminants it is ideal to have a minimal number of potential entry paths to the interior of the module. Paths or breaks in the plastic between the interior and exterior of the pod such as for fasteners or at the junction of separate component parts of the module are to be avoided, and, if required, the breaks or openings in the module between the interior and exterior are sealed such as by elastomeric seals. Furthermore, the use at any location in the pod of metallic fasteners or other metal parts are highly undesirable in semiconductor wafer carriers or containers. Metallic parts generate highly damaging particulates when rubbed or scraped. Assembly of a module with fasteners causes such rubbing and scraping. Thus, the use of transport modules requiring metal fasteners or other metal parts are to be avoided. Such modules have a path to ground from the wafer shelves to the equipment interface through several different components including metallic screws.

Typically, such containers are constructed by assembling several plastic parts. However, due to inconsistencies in molding plastic parts, assembly of such plastic parts lead to inconsistencies, such as open cracks between parts and the stacking of the tolerances of each individual part leading to undesirable variations in critical dimensions. Additionally, a handle attached to the top of the container provides the means to lift and transport the container. This handle may be used for manual lifting or, as in the case of the heavier containers, adapted for being lifted by a robotic end-effector. In either case, lifting the container using the handle induces stresses in the top wall of the enclosure. If the handle does not distribute the load over a larger area of the top wall, the stress distribution is likely to be localized over a small area near the points of attachment of the handle to the top wall. Depending on this stress profile, the resulting strains could cause a deformation mode of the top wall which distorts the dimensions of the opening on the front side of the module where it engages with the front door leading to the burping of the FOUP/FOSB seal and a breach of the sealed enclosure.

SUMMARY OF THE INVENTION

One of the primary purposes of a FOUP/FOUS is to provide a protective, contaminant-free, sealed enclosure for the wafer cassettes containing the semiconductor wafers. Additionally, as described above, industry standards require the container to be capable of accurately and repeatedly interfacing with external material handling and processing equipment. In particular, the FOUP/FOUS needs to be transported from one location to another without breaching the sealed interconnections that are essential to maintaining the protective, dust-free environment within the enclosure.

The instant invention utilizes a single, monolithic shell with a top wall, an opposed bottom wall, a back wall opposite a front opening sized to receive a door and opposed lateral walls coterminous with the top, bottom, and back walls. On assembly of the door into the front opening, the shell comprises a substantially enclosed, sealed wafer container for the wafer support members. The walls of the shell may be provided with structures defining interface means to allow the container to be interfaced with external processing machines or robotic end-effectors for transport or transfer. In a preferred embodiment, the bottom wall is in supported relationship with a conductive plate which in turn is preferentially connected to ground.

Unlike prior art containers which utilize a robotic-flange attachment at the top wall of the container, interfaces with a robotic end-effector for lifting the container during transport or transfer, a feature and advantage of the instant invention is the robotic flange, although located on top of the container and forming an interface via which the robotic end-effector lifts the wafer container, in a preferred embodiment the flange is not rigidly attached to the top wall of the container. Instead, the robotic-flange is a component of a lift-saddle. The lift-saddle is comprised of a pair of straps, each strap is fixedly attached to a lateral side of the robotic flange and drapes along a lateral wall of the container. Each strap has a plurality of strap engagement members configured to engage with corresponding support brackets on the lateral side walls of the container shell whereby the load on the robotic-flange is transferred, via the straps, to the lateral side walls of the container. This arrangement prevents the load induced distortion of the top shell wall and eliminates the consequent FOUP/FOSB seal burping.

In an alternate embodiment, the container is provided with a wafer support column which has an overmolded conductive artery array to dissipate static charges. Conductive tabs electrically connected to the conductive artery protrude from the side of the container shell as well as from the bottom of the container. There is at least one conductive side tab protruding from each lateral side wall and in electrical connection with a support bracket on the side wall such that on engagement of a strap engagement member with a support bracket, the strap and the robotic-flange comprise an electrically conductive path to the conductive plate.

In another alternate embodiment, each strap of the lift-saddle is provided with at least two spaced apart "U" shaped ribs configured to snap-fit into corresponding, spaced apart, "U" shaped hoops on the shell. On engaging the "U" shaped ribs with the "U" shaped hoops, the straps form a graspable loop handle between the two hoops. The loop is suitable for manual lifting of the container.

BRIEF DESCRIPTION OF THE DRAWINGS

FIG. 6 exemplifies wafer support columns

FIG. 7 is a side view showing the lift-saddle strap engaged with the side wall of the container.

FIG. 8 is a side view of an example of a conductive tab on the side wall of the container

DETAILED SPECIFICATION

Referring to FIGS. 1, 2, 3, 4 and 5 a container module for wafers generally designated with the numeral 20 is principally comprised of a container portion 25 and a lift-saddle 30.

Figure 1:
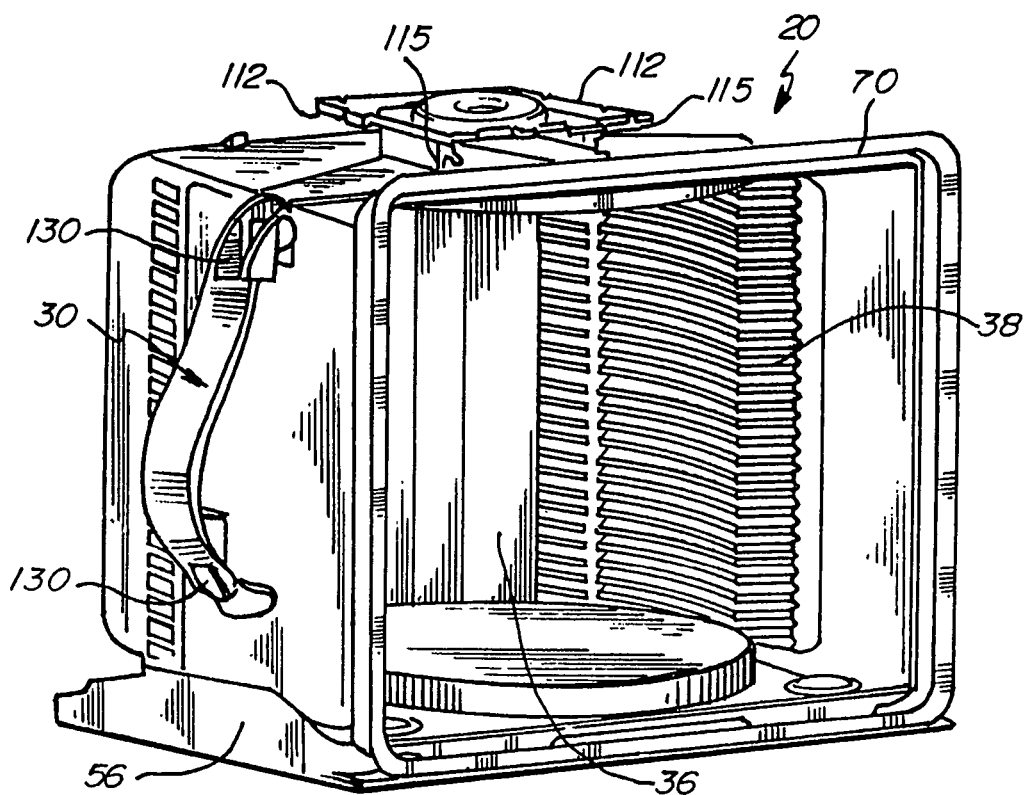
FIG. 1 is a perspective view of a container of the instant invention
Figure 2:
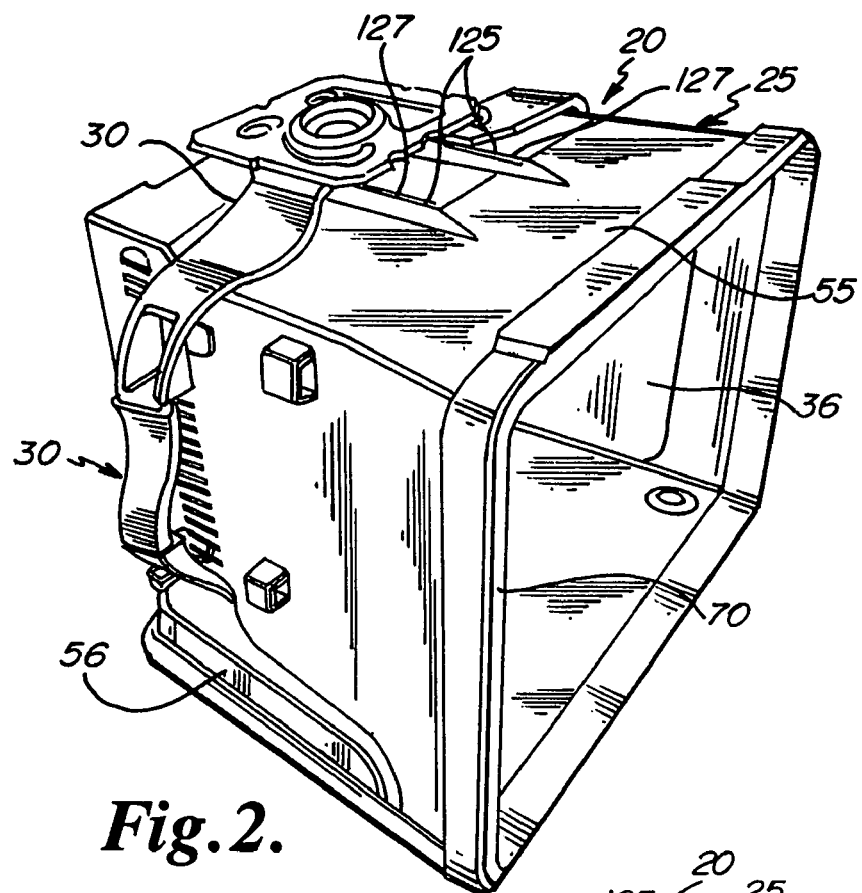
FIG. 2 is a perspective view of a container of the instant invention exemplifying disengaged lift-saddle.

The container portion 25 is comprised principally of a shell 50 which has a top wall 55, a bottom wall 60, an open front side 70, a left side wall 74, and a right side wall 76 both with lift-saddle receiving portions configured as "U" shaped loops 78 and 80 extending outwardly from each side wall. The sidewalls are continuous and solid. FIGS. 1 and 2 show the open interior 36 of the container with a plurality of wafer retainers 38 axially arranged in said open interior. The wafer retainers are formed of flexible teeth 44 which are of resilient molded plastic. FIG. 2 also depicts a conductive plate 56 on which the container 25 is supported. In a preferred embodiment, the conductive plate 56 is electrically grounded and is designed with three interface structures that comprise a kinematic coupling.

Figure 4:
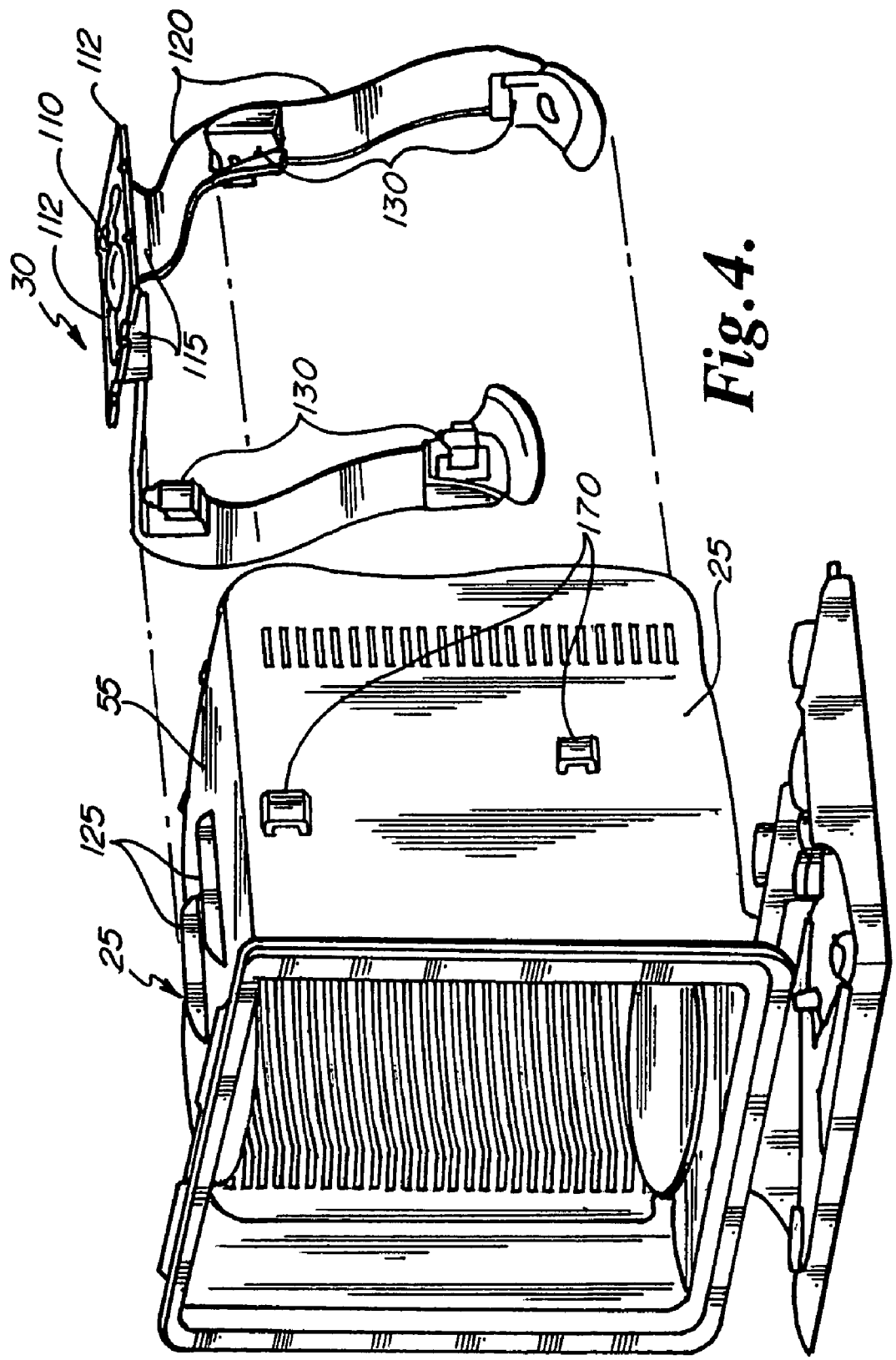
FIG. 4 is a perspective view of the container and the saddle disengaged from each other.

The lift-saddle 30 includes a robotic lifting flange 110 shown in FIG. 4. The robotic lifting flange has two lateral edges 112 and a pair of opposed guide slots 115. The top wall 55 of the container 25 has a pair spaced apart, longitudinal guide rails 125 projecting outward from the top wall 55 and generally extending along a direction parallel to the plane of the side walls 74 and 76, each guide rail being adapted to be slidably received within guide slots 115 of the robotic lifting flange 110. The guide rails 125 have a lip 127 which functions to constrain the robotic lifting flange from disengaging the guide rails when moved in a direction outward and away from the top wall 55 but allow the robotic lifting flange 110 to move along the length of the guide rails 125. Straps 120 depend from each lateral edge 112 of the robotic flange 110. Each strap 120 is provided with at least one "U" shaped rib 130 adapted to be removably received inside corresponding, "U" shaped loop 170 on each lateral wall 74 and 76 of the container 25.

Figure 5:
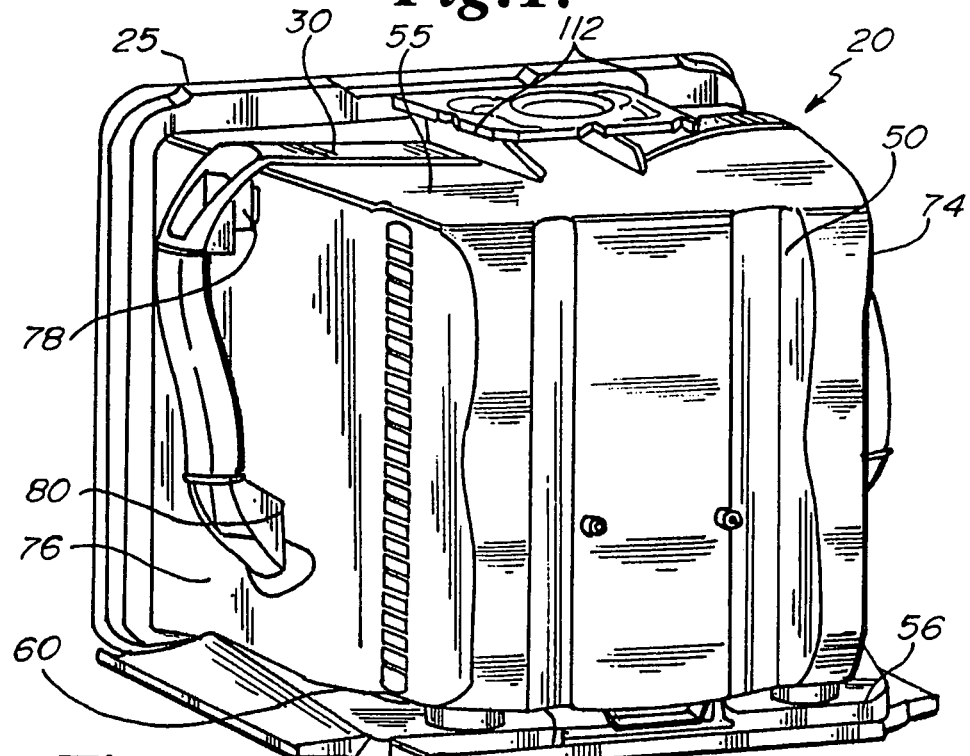
FIG. 5 is a rear perspective view of the container

In a preferred embodiment, exemplified in FIGS. 5 and 7, the robotic-flange is adapted to interface with a robotic end-effector which can cause the container to be lifted for transport or transfer. Lifting the container in such a manner causes a force to act on the robotic-flange. This force may be both due to the weight of the container as well as inertial loads caused when the container is accelerated or decelerated during transport or transfer. In the preferred embodiment, the guide slots 115 and the lift-saddle 30 are configured such that if the "U" shaped ribs on the strap are in engagement with the corresponding "U" shaped loops on the side walls 74 and 76 of the container 25, the load induced stress on the robotic-flange are transferred through the straps 120 to the "U" shaped rib and into the "U" shaped loop on the side wall of the container. The guide slot 115 are dimensioned such that they do not come into contact with the lips 127 of the guide rails 125 for a wide range of structural deflections of the robotic flange. However, on excessive deflection of the robotic flange, the lips 127 do come into frictional contact with the guide slot 115 and thereby prevent excessive loading of the straps 120.

Figure 3:
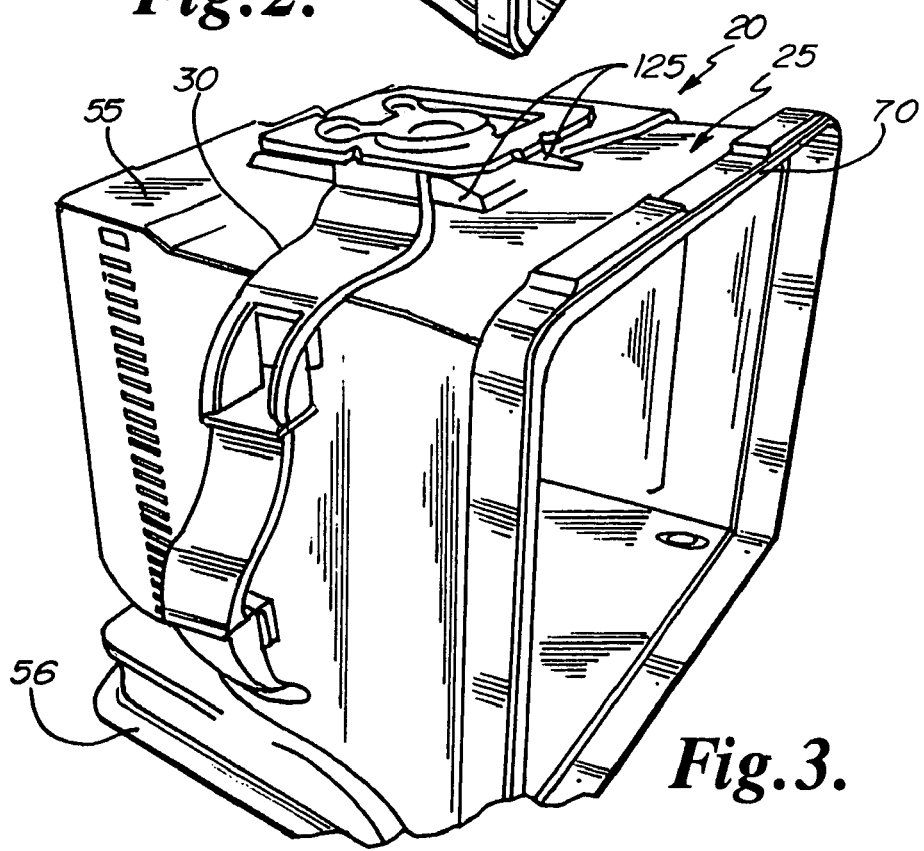
FIG. 3 is a perspective view of a container of the instant invention exemplifying a lift-saddle in engagement with the "U" shaped loops on the side wall of the container.

In another preferred embodiment, each strap 120 of the lift-saddle is provided with at least two spaced apart "U" shaped ribs 130 configured to snap-fit into corresponding, spaced apart, "U" shaped loops 170 on the container side walls. On engaging both "U" shaped ribs with the corresponding "U" shaped loops on the side walls, the straps form a graspable loop handle between the two loops suitable for manual lifting of the container as shown in FIGS. 1 and 3.

A third preferred embodiment of the invention, the container 25 is provided with a wafer support column 38 as exemplified in FIG. 6. This support column has an overmolded conductive artery array 260 to dissipate static charges. Conductive tabs 270, 275 electrically connected to the conductive artery protrude from the side of the container shell as well as from the bottom of the container. There is at least one conductive side tab 300 protruding from each lateral side wall, as exemplified in FIG. 8, and in electrical connection with a "U" shaped loop on the side wall such that on engagement of a "U" shaped loop with a "U" shaped rib on the strap, the strap and the conductive robotic-flange form an electrically conductive path to the conductive plate 56 effectively grounding any static charge buildup on the container 25.

The present invention may be embodied in other specific forms without departing from the central attributes thereof, therefore, the illustrated embodiments should be considered in all respects as illustrative and not restrictive, reference being made to the appended claims rather than the foregoing description to indicate the scope of the invention.

What is claimed is:

1. A carrier for transporting semiconductor wafers, the carrier comprising:
   a container portion comprising a top, a bottom, lateral sides with sidewalls, and a back wall defining an enclosure closed except for an open front, the container portion configured for supporting the wafers horizontally;
   a U-shaped lift saddle and robotic flange extending over the top of the container portion and extending down the sides of the container portion with the robotic flange located above the top of the container portion, the lift saddle including a pair of straps, each strap having a plurality of spaced apart fastening structures, the sidewalls of the container portion having a plurality of strap engagement brackets, each fastening structure selectively engagable with a separate one of the strap engagement brackets to attach the U-shaped lift saddle and robotic flange to the sidewalls of the enclosure portion, wherein the U-shaped saddle with the robotic flange is not rigidly attached to the top or bottom of the container portion such that lifting of the container portion by the robotic flange will transfer loading to the sidewalls of the container portion rather than the top of the container portion thereby minimizing distortion of the container portion.

2. The carrier as claimed in claim 1, in which the pair of straps of the lift saddle are configured as handles shaped to accommodate manual lifting of the carrier.

3. The carrier as claimed in claim 1, wherein the U-shaped saddle and robotic flange have a guide and the container portion comprises a guide rail formed in the top, the guide rail received in the guide slot, and being arranged such that only when an excessive load is applied to the U-shaped lift saddle and robotic flange via the flange, that the U-shaped saddle and robotic flange will engage the guide rail at the guide slot to transfer loading to the top of the container portion whereby excessive loading of the U-shaped lift saddle and robotic flange through the straps extending down the sidewalls is prevented.

4. A method of maintaining seal integrity while transporting silicon semiconductor wafers in a carrier having an enclosure with a front opening and a door during semiconductor wafer processing operations, the seal being between the enclosure and the door, the enclosure having a top, a pair of opposing lateral sides and a bottom, the method comprising the steps of:
   operably connecting a flange to a lift saddle, the flange being structured to interface with a machine operated end effector such that the carrier can be lifted by the machine via the flange;
   operably connecting the lift saddle and robotic flange to each of the pair of lateral sides of the enclosure at a plurality of spaced apart locations on each lateral side and not rigidly attaching the lift saddle and robotic flange to the top of the enclosure whereby distortion of the enclosure is minimized under loading thus maintaining seal integrity between the enclosure and the door.

5. The method as claimed in claim 4, further comprising the step of removably connecting the lift saddle and robotic flange to the enclosure.

6. The method as claimed in claim 4, further comprising the steps of providing the lift saddle with handles shaped to accommodate manual lifting of the carrier and manually lifting the carrier by grasping the handles.

7. The method as claimed in claim 4, further comprising the steps of providing a guide slot in the lifting saddle and robotic flange; providing a guide rail in the top of the enclosure, and arranging the guide slot and the guide rail such that only if an excessive load is applied to the lift saddle via the flange the guide slot will contact the guide rail transferring loading to the top of the carrier whereby excessive loading of the lift saddle is prevented.

8. A carrier for transporting silicon semiconductor wafers during semiconductor wafer processing operations, the carrier comprising:
   a front opening container comprising an enclosure and an openable door, the enclosure having a top, lateral sides and a bottom;
   means for interfacing with a machine operated end effector, the means including a robotic flange and lifting saddle not rigidly attached to the top of the container such that the carrier can be lifted by the machine via the means for interfacing; and
   means for interconnecting the means for interfacing to the enclosure such that the load on the flange is transferred to a part of the enclosure other than the top of the container whereby distortion of the enclosure is minimized thus maintaining seal integrity between the enclosure and the door.

9. The carrier as claimed in claim 8, in which the interfacing means is located above the top of the enclosure.

10. The carrier as claimed in claim 8, in which the interconnecting means is operably connected to the lateral sides of the enclosure.

11. The carrier as claimed in claim 10, in which the interconnecting means is operably connected to each lateral side at two different locations on each lateral side.

12. The carrier as claimed in claim 10, in which the interconnecting means further comprises means for manual grasping to accommodate manual lifting of the carrier.

13. The carrier as claimed in claim 10, further comprising means for preventing excessive loading of the interconnecting means.

14. The carrier as claimed in claim 13, in which the means for preventing excessive loading comprises a guide slot operably connected to the flange and a guide rail formed in the top of the enclosure, the guide slot and the guide rail being arranged such that if an excessive load is applied to the lift saddle via the flange the guide slot will contact the guide rail.

* * * * *